United States Patent
Wang et al.

(10) Patent No.: US 11,549,986 B2
(45) Date of Patent: Jan. 10, 2023

(54) VOLTAGE DETECTION DEVICE

(71) Applicant: Yazaki Corporation, Tokyo (JP)

(72) Inventors: Jian Wang, Shizuoka (JP); Hironao Fujii, Shizuoka (JP); Saki Oonishi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 27 days.

(21) Appl. No.: 17/168,174

(22) Filed: Feb. 5, 2021

(65) Prior Publication Data

US 2021/0247449 A1 Aug. 12, 2021

(30) Foreign Application Priority Data

Feb. 10, 2020 (JP) .............................. JP2020-020384

(51) Int. Cl.
*G01R 31/36* (2020.01)
*H03F 3/45* (2006.01)
*H03G 3/30* (2006.01)
*G01R 31/389* (2019.01)

(52) U.S. Cl.
CPC ....... *G01R 31/3644* (2013.01); *G01R 31/389* (2019.01); *H03F 3/45475* (2013.01); *H03G 3/30* (2013.01); *H03G 2201/103* (2013.01)

(58) Field of Classification Search
CPC ................ G01R 31/385; G01R 31/392; G01R 31/3646; G06N 7/005; H03F 3/45475; H01M 10/48; H03G 3/30

USPC .............................. 324/425–430, 76.11, 600
See application file for complete search history.

(56) References Cited

U.S. PATENT DOCUMENTS

| | | | |
|---|---|---|---|
| 5,254,951 A | 10/1993 | Goto et al. | |
| 10,637,267 B2* | 4/2020 | Syouda | .............. H02J 7/0047 |
| 2005/0218976 A1* | 10/2005 | Haraguchi | .......... H03F 3/45977 330/69 |
| 2013/0300503 A1 | 11/2013 | Hebert | |
| 2017/0033415 A1 | 2/2017 | Takahashi et al. | |
| 2018/0212279 A1* | 7/2018 | Wang | .................... H01M 10/02 |

FOREIGN PATENT DOCUMENTS

| | | |
|---|---|---|
| JP | H04-351969 A | 12/1992 |
| JP | 2004-117095 A | 4/2004 |
| JP | 2017-32349 A | 2/2017 |
| JP | 2018-116012 A | 7/2018 |

* cited by examiner

Primary Examiner — Lee E Rodak
Assistant Examiner — Trung Q Nguyen
(74) *Attorney, Agent, or Firm* — Kenealy Vaidya LLP (57) ABSTRACT

A voltage detection circuit includes a differential amplification circuit and a microcontroller unit (MCU). The MCU detects a differential voltage output from operational amplifiers of the differential amplification circuit, and calculates an internal resistance value of a battery cell based on the detected differential voltage. At this time, the MCU controls an amplification factor adjustment circuit of the differential amplification circuit based on a maximum voltage representing the highest voltage detectable by the MCU and the differential voltage output from the differential amplification circuit so as to set the amplification factor of the operational amplifiers.

5 Claims, 4 Drawing Sheets

VOLTAGE DETECTION DEVICE

CROSS-REFERENCE TO RELATED APPLICATION(S)

The present application claims priority to and incorporates by reference the entire contents of Japanese Patent Application No. 2020-020384 filed in Japan on Feb. 10, 2020.

BACKGROUND OF THE INVENTION

1. Field of the Invention

The present invention relates to a voltage detection device.

2. Description of the Related Art

Conventionally, for example, in Japanese Patent Application Laid-open No. 2018-116012, a differential voltage measurement device is described that includes a differential amplifier that amplifies a differential voltage between a first voltage supplied from a battery and a second voltage of power supplied from the battery, and also includes a µCOM that detects an internal resistance value of the battery based on the differential voltage output from the differential amplifier.

In the differential voltage measurement device described in Japanese Patent Application Laid-open No. 2018-116012, for example, if the amplification factor of the differential amplifier is increased to increase detection accuracy, the highest voltage detectable by the µCOM may be exceeded when the internal resistance value of the battery has increased due to aging degradation of the battery, and if, in contrast, the amplification factor of the differential amplifier is reduced, the detection accuracy of the differential amplifier may decrease although the highest voltage detectable by the µCOM is not exceeded.

SUMMARY OF THE INVENTION

The present invention has been made in view of the above-described problem, and an object thereof is to provide a voltage detection device capable of accurately detecting the internal resistance value of the battery.

In order to solve the above mentioned problem and achieve the object, a voltage detection device according to one aspect of the present invention includes a differential amplification circuit configured to include a first input terminal configured to receive a first voltage of power supplied from a battery, a second input terminal configured to receive a second voltage of the power that is a voltage different from the first voltage and is supplied from the battery, an amplification factor adjustment circuit capable of adjusting a voltage amplification factor, an amplification circuit configured to amplify a differential voltage between the first voltage received from the first input terminal and the second voltage received from the second input terminal at the amplification factor adjusted by the amplification factor adjustment circuit, and an output terminal configured to output the differential voltage amplified by the amplification circuit; and a control circuit configured to detect the differential voltage output from the differential amplification circuit and calculate an internal resistance value of the battery based on the differential voltage, and configured to control the amplification factor adjustment circuit, wherein the control circuit is configured to control the amplification factor adjustment circuit based on a maximum voltage representing a highest voltage detectable by the control circuit and the differential voltage output from the output terminal so as to set the amplification factor of the amplification circuit.

According to another aspect of the present invention, in the voltage detection device, it is preferable that the control circuit is configured to control the amplification factor adjustment circuit to reduce the amplification factor of the amplification circuit when the differential voltage output from the output terminal has reached the maximum voltage.

According to still another aspect of the present invention, in the voltage detection device, it is preferable that the amplification factor adjustment circuit includes a plurality of resistors and a switch circuit configured to switch connections of the resistors, and is configured to cause the switch circuit to switch the connections of the resistors so as to adjust the amplification factor of the amplification circuit.

In order to achieve the object, a voltage detection device according to still another aspect of the present invention includes a differential amplification circuit configured to include a first input terminal configured to receive a first voltage of power supplied from a battery, a second input terminal configured to receive a second voltage of the power that is a voltage different from the first voltage and is supplied from the battery, an amplification factor adjustment circuit capable of adjusting a voltage amplification factor, an amplification circuit configured to amplify a differential voltage between the first voltage received from the first input terminal and the second voltage received from the second input terminal at the amplification factor adjusted by the amplification factor adjustment circuit, and an output terminal configured to output the differential voltage amplified by the amplification circuit; and a control circuit configured to detect the differential voltage output from the differential amplification circuit and calculate an internal resistance value of the battery based on the differential voltage, and configured to control the amplification factor adjustment circuit, wherein the control circuit is configured to control the amplification factor adjustment circuit according to a period of use in which the battery has been used so as to set the amplification factor of the amplification circuit.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The following describes a mode (embodiment) for carrying out the present invention in detail with reference to the drawings. The present invention is not limited to the description of the embodiment given below. Components described below include those easily conceivable by those skilled in the art or those substantially identical thereto. Moreover, configurations described below can be combined as appropriate. In addition, the configurations can be variously omitted, replaced, or changed within the scope not deviating from the gist of the present invention.

EMBODIMENT

Figure 1:
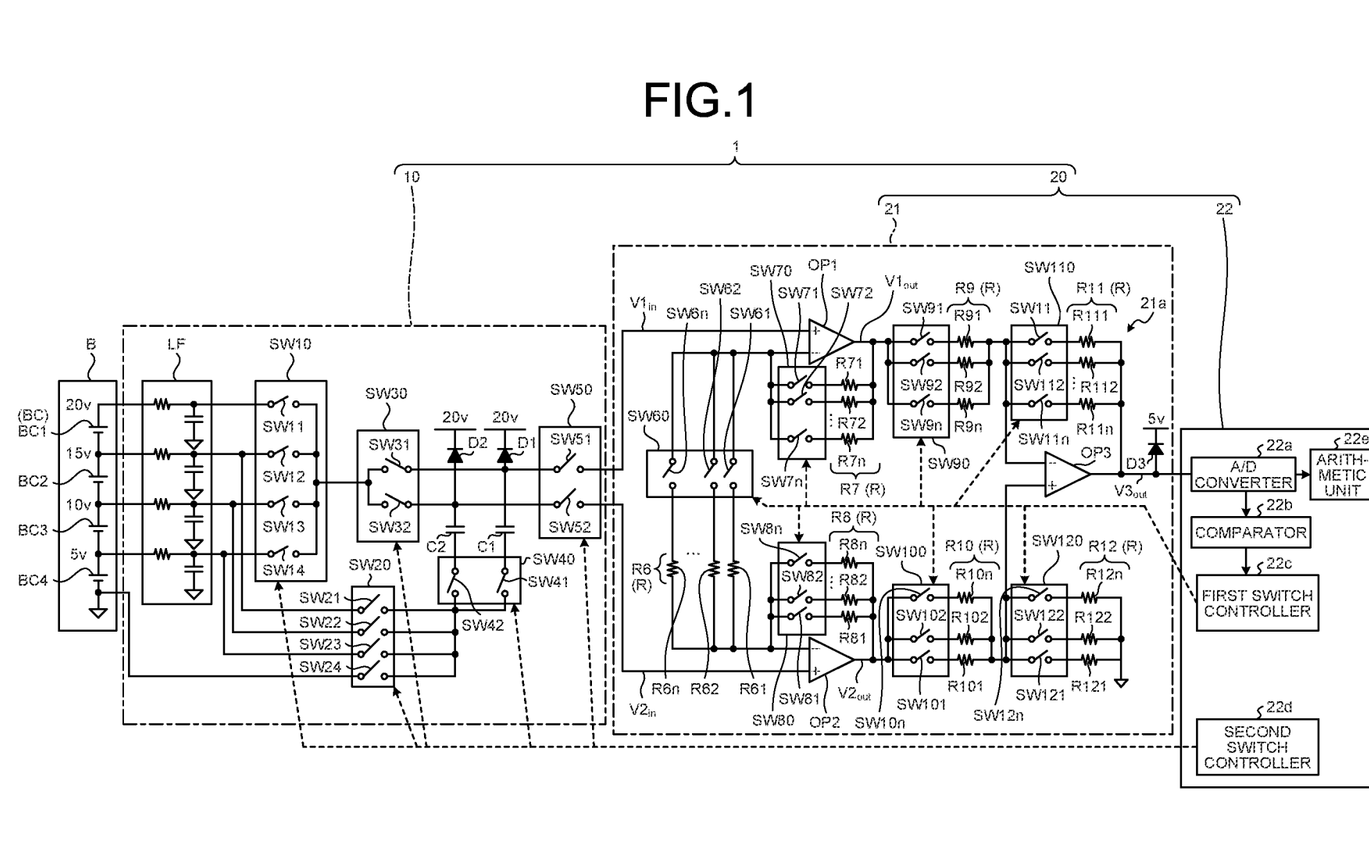
FIG. 1 is a circuit diagram illustrating a configuration example of a battery state detection device according to an embodiment of the present invention.
Figure 2:
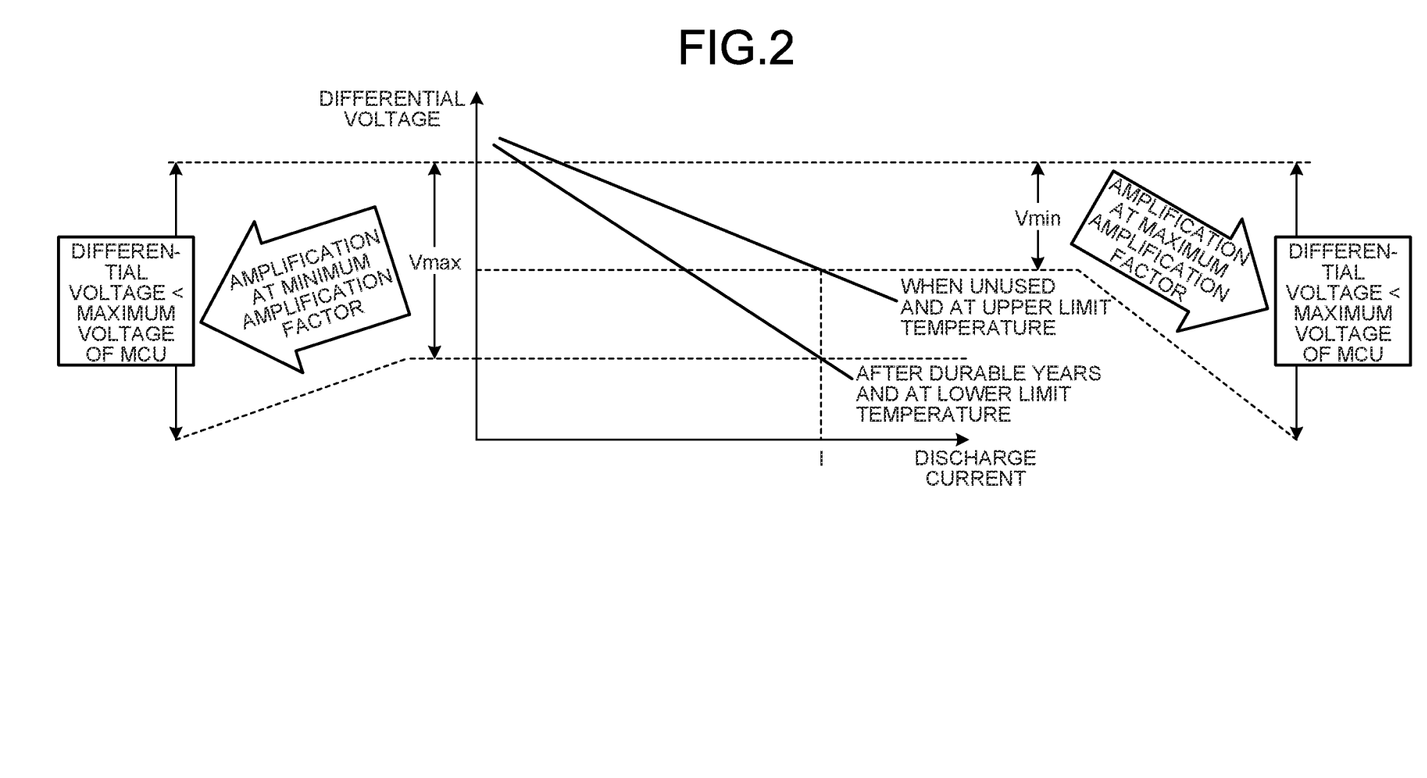
FIG. 2 is a diagram illustrating relations between a differential voltage and a discharge current according to the embodiment.

A battery state detection device 1 according to the embodiment will be described with reference to the drawings. FIG. 1 is a circuit diagram illustrating a configuration example of the battery state detection device 1 according to the embodiment. FIG. 2 is a diagram illustrating relations between a differential voltage and a discharge current according to the embodiment. While FIG. 2 illustrates the discharge current, a relation diagram illustrating the same tendency can also be obtained for a charge current except that reduction in the voltage is replaced with increase in the voltage. The battery state detection device 1 is a device that is mounted on a vehicle, and estimates degradation of battery cells BC (BC1 to BC4) constituting an assembled battery B of the vehicle. The battery state detection device 1 includes a battery switching circuit 10 and a voltage detection circuit 20.

The assembled battery B is a battery capable of charging and discharging direct-current power, and is, for example, a lithium-ion battery. The assembled battery B includes the battery cells BC such as the four battery cells BC1 to BC4. The battery cells BC1 to BC4 have each a voltage of approximately 5 V, and are connected in series. The assembled battery B causes the battery cells BC1 to BC4 connected in series to supply the power at a voltage of approximately 20 V.

The battery switching circuit 10 is a circuit that switches to a target battery cell BC to be estimated for the degradation among the battery cells BC. The battery switching circuit 10 includes a low-pass filter LF, capacitors C1 and C2, diodes D1 and D2, and switch circuits SW10 to SW50.

The low-pass filter LF cuts out electrical signals having high frequencies. The low-pass filter LF includes resistors and capacitors. The low-pass filter LF is connected to the assembled battery B, and the low-pass filter LF passes electrical signals having frequencies lower than a preset frequency, and cuts out electrical signals having frequencies higher than the preset frequency. Through this operation, the low-pass filter LF can remove noise included in the power supplied from the assembled battery B.

The capacitor C1 stores an electrical charge and discharges the stored electrical charge. The capacitor C1 is connected to the battery cells BC through the switch circuits SW10 to SW40, and stores the electrical charge of the power supplied from the battery cells BC. The capacitor C1 is also connected to a differential amplification circuit 21 through the switch circuit SW50, and discharges the stored electrical charge to the differential amplification circuit 21.

The capacitor C2 stores an electrical charge and discharges the stored electrical charge. The capacitor C2 is connected to the battery cells BC through the switch circuits SW10 to SW40, and stores the electrical charge of the power supplied from the battery cells BC. The capacitor C2 is also connected to the differential amplification circuit 21 through the switch circuit SW50, and discharges the stored electrical charge to the differential amplification circuit 21.

The diode D1 conducts a current in one direction. The diode D1 is connected through an anode terminal thereof to a terminal of the capacitor C1, and through a cathode terminal thereof to a power supply system of 20 V. The diode D1 conducts the current when an overcurrent flows through the capacitor C1, and thus, protects a circuit including the capacitor C1.

The diode D2 conducts a current in one direction. The diode D2 is connected through an anode terminal thereof to a terminal of the capacitor C2, and through a cathode terminal thereof to the power supply system of 20 V. The diode D2 conducts the current when an overcurrent flows through the capacitor C2, and thus, protects a circuit including the capacitor C2.

The switch circuit SW10 conducts or shuts off currents. The switch circuit SW10 is connected to a microcontroller unit (MCU) 22 described later, and is turned on or off based on a control signal output from the MCU 22. The switch circuit SW10 is provided between the low-pass filter LF and the switch circuit SW30, and conducts or shuts off currents flowing from positive electrodes of the battery cells BC through the low-pass filter LF. The switch circuit SW10 conducts a current of, for example, one battery cell BC among the battery cells BC. The switch circuit SW10 includes switches SW11 to SW14.

The switch SW11 is connected to a positive electrode of the battery cell BC1 and the switch circuit SW30. Based on the control signal output from the MCU 22, the switch SW11 is turned on to conduct a current flowing from the positive electrode of the battery cell BC1, or turned off to shut off the current flowing from the positive electrode of the battery cell BC1. The switch SW12 is connected to a positive electrode of the battery cell BC2 and the switch circuit SW30. Based on the control signal output from the MCU 22, the switch SW12 is turned on to conduct a current flowing from the positive electrode of the battery cell BC2, or turned off to shut off the current flowing from the positive electrode of the battery cell BC2. The switch SW13 is connected to a positive electrode of the battery cell BC3 and the switch circuit SW30. Based on the control signal output from the MCU 22, the switch SW13 is turned on to conduct a current flowing from the positive electrode of the battery cell BC3, or turned off to shut off the current flowing from the positive electrode of the battery cell BC3. The switch SW14 is connected to a positive electrode of the battery cell BC4 and the switch circuit SW30. Based on the control signal output from the MCU 22, the switch SW14 is turned on to conduct a current flowing from the positive electrode of the battery cell BC4, or turned off to shut off the current flowing from the positive electrode of the battery cell BC4.

The switch circuit SW20 conducts or shuts off currents. The switch circuit SW20 is connected to the MCU 22, and is turned on or off based on the control signal output from the MCU 22. The switch circuit SW20 is provided between the low-pass filter LF and the switch circuit SW40, and conducts or shuts off currents flowing to negative electrodes of the battery cells BC through the low-pass filter LF. The switch circuit SW20 conducts a current of, for example, one battery cell BC among the battery cells BC. The switch circuit SW20 includes switches SW21 to SW24.

The switch SW21 is connected to a negative electrode of the battery cell BC1 and the switch circuit SW40. Based on the control signal output from the MCU 22, the switch SW21 is turned on to conduct a current flowing to the negative electrode of the battery cell BC1, or turned off to shut off the current flowing to the negative electrode of the battery cell BC1. The switch SW22 is connected to a negative electrode of the battery cell BC2 and the switch circuit SW40. Based on the control signal output from the MCU 22, the switch SW22 is turned on to conduct a current flowing to the negative electrode of the battery cell BC2, or turned off to shut off the current flowing to the negative electrode of the battery cell BC2. The switch SW23 is connected to a negative electrode of the battery cell BC3 and the switch circuit SW40. Based on the control signal output from the MCU 22, the switch SW23 is turned on to conduct a current flowing to the negative electrode of the battery cell BC3, or turned off to shut off the current flowing to the negative electrode of the battery cell BC3. The switch SW24 is connected to a negative electrode of the battery cell BC4 and the switch circuit SW40. Based on the control signal output from the MCU 22, the switch SW24 is turned on to conduct a current flowing to the negative electrode of the battery cell BC4, or turned off to shut off the current flowing to the negative electrode of the battery cell BC4.

The switch circuit SW30 conducts or shuts off currents. The switch circuit SW30 is connected to the MCU 22, and is turned on or off based on the control signal output from the MCU 22. The switch circuit SW30 is provided between the switch circuit SW10 and the capacitors C1 and C2, and conducts or shuts off currents flowing from the positive electrodes of the battery cells BC to the capacitors C1 and C2 through the switch circuit SW10 and so on. The switch circuit SW30 includes switches SW31 and SW32.

The switch SW31 is connected to the switch circuit SW10 and the capacitor C1. Based on the control signal output from the MCU 22, the switch SW31 is turned on to conduct a current flowing from a positive electrode of the target battery cell BC, that is, one of the battery cells BC placed in a conduction state by the switch circuit SW10 to the capacitor C1, or turned off to shut off the current flowing from the positive electrode of the target battery cell BC to the capacitor C1. The switch SW32 is connected to the switch circuit SW10 and the capacitor C2. Based on the control signal output from the MCU 22, the switch SW32 is turned on to conduct a current flowing from the positive electrode of the target battery cell BC to the capacitor C2, or turned off to shut off the current flowing from the positive electrode of the target battery cell BC to the capacitor C2.

The switch circuit SW40 conducts or shuts off currents. The switch circuit SW40 is connected to the MCU 22, and is turned on or off based on the control signal output from the MCU 22. The switch circuit SW40 is provided between the capacitors C1 and C2 and the switch circuit SW20, and conducts or shuts off currents flowing from the capacitors C1 and C2 to the negative electrodes of the battery cells BC through the switch circuit SW20 and so on. The switch circuit SW40 includes switches SW41 and SW42.

The switch SW41 is connected to the capacitor C1 and the switch circuit SW20. Based on the control signal output from the MCU 22, the switch SW41 is turned on to connect a path from the capacitor C1 to a negative electrode of the target battery cell BC, that is, one of the battery cells BC placed in the conduction state by the switch circuit SW20, or turned off to disconnect the path from the capacitor C1 to the negative electrode of the target battery cell BC. The switch SW42 is connected to the capacitor C2 and the switch circuit SW20. Based on the control signal output from the MCU 22, the switch SW42 is turned on to connect a path from the capacitor C2 to the negative electrode of the target battery cell BC, or turned off to disconnect the path from the capacitor C2 to the negative electrode of the target battery cell BC.

The switch circuit SW50 applies or disconnects voltages. The switch circuit SW50 is connected to the MCU 22, and is turned on or off based on the control signal output from the MCU 22. The switch circuit SW50 is provided between the capacitors C1 and C2 and the voltage detection circuit 20, and applies voltages supplied from the capacitors C1 and C2 to the voltage detection circuit 20 or disconnects the voltages. The switch circuit SW50 includes switches SW51 and SW52.

The switch SW51 is connected to the capacitor C1 and the voltage detection circuit 20. Based on the control signal output from the MCU 22, the switch SW51 is turned on to apply a voltage from the capacitor C1 to the voltage detection circuit 20, or turned off to disconnect the voltage supplied from the capacitor C1 to the voltage detection circuit 20. The switch SW52 is connected to the capacitor C2 and the voltage detection circuit 20. Based on the control signal output from the MCU 22, the switch SW52 is turned on to apply a voltage from the capacitor C2 to the voltage detection circuit 20, or turned off to disconnect the voltage supplied from the capacitor C2 to the voltage detection circuit 20.

The voltage detection circuit 20 includes the differential amplification circuit 21 and the MCU 22 that serves as a control circuit.

The differential amplification circuit 21 amplifies the differential voltage representing a difference between two different voltages, and outputs the result. The differential amplification circuit 21 is what is called an instrumentation amplifier, and includes an input terminal (noninverting input terminal) V1in serving as a first input terminal, an input terminal (noninverting input terminal) V2in serving as a second input terminal, an output terminal V3out, a diode D3, operational amplifiers OP1 to OP3 serving as amplification circuits, and an amplification factor adjustment circuit 21a.

The input terminal V1in receives a voltage. The input terminal V1in is connected to the capacitor C1 through the switch SW51 of the battery switching circuit 10, and receives a voltage of the battery cell BC stored in the capacitor C1. That is, the voltage (first voltage) of the battery cell BC stored in the capacitor C1 is applied to the input terminal V1in. The input terminal V1in is connected to the operational amplifier OP1, and outputs the received first voltage to the operational amplifier OP1.

The input terminal V2in receives a voltage. The input terminal V2in is connected to the capacitor C2 through the switch SW52 of the battery switching circuit 10, and receives a voltage of the battery cell BC stored in the capacitor C2. That is, the voltage (second voltage) of the battery cell BC stored in the capacitor C2 is applied to the input terminal V2in. The second voltage differs from the above-described first voltage. The input terminal V2in is connected to the operational amplifier OP2, and outputs the received second voltage to the operational amplifier OP2.

The operational amplifier OP1 amplifies a voltage. The operational amplifier OP1 is connected to the input terminal V1in, and amplifies the first voltage output from the input terminal V1in at an amplification factor adjusted by the amplification factor adjustment circuit 21a to output the amplified first voltage from an output terminal V1out of the operational amplifier OP1 to the operational amplifier OP3.

The operational amplifier OP2 amplifies a voltage. The operational amplifier OP2 is connected to the input terminal V2in, and amplifies the second voltage output from the input terminal V2in at an amplification factor adjusted by the amplification factor adjustment circuit 21a to output the amplified second voltage from an output terminal V2out of the operational amplifier OP2 to the operational amplifier OP3.

The operational amplifier OP3 amplifies a voltage. The operational amplifier OP3 is connected to the output terminal V1out of the operational amplifier OP1 and the output terminal V2out of the operational amplifier OP2, and amplifies a differential voltage between the first voltage output from the output terminal V1out and the second voltage output from the output terminal V2out at an amplification factor adjusted by the amplification factor adjustment circuit 21a. The operational amplifier OP3 is connected to the MCU 22 through the output terminal V3out, and outputs the amplified differential voltage through the output terminal V3out to the MCU 22.

The diode D3 conducts a current in one direction. The diode D3 is connected through an anode terminal thereof to the output terminal V3out, and through a cathode terminal thereof to a power supply system of 5 V. The diode D3 conducts the current when an overcurrent flows from the output terminal V3out, and thus, protects the MCU 22.

The amplification factor adjustment circuit 21a adjusts the voltage amplification factor. The amplification factor adjustment circuit 21a includes a plurality of resistance units R6 to R12 and switch circuits SW60 to SW120 that switch connections of the resistance units R6 to R12. The amplification factor adjustment circuit 21a causes the switch circuits SW60 to SW120 to switch connections of resistors R of the resistance units R6 to R12 so as to adjust the amplification factor of the operational amplifiers OP1 to OP3.

The amplification factor of the operational amplifiers OP1 to OP3 is adjusted by switching the connections of the resistors R of the resistance units R6 to R12. A plurality of patterns of the amplification factor are prepared in advance. The patterns of the amplification factor are obtained based on an internal resistance value of each of the battery cells BC corresponding to durable years and a temperature range (range from an upper limit temperature to a lower limit temperature during use) of the battery cell BC. The internal resistance value is the lowest resistance value when the battery cell BC is unused and at the upper limit temperature. In contrast, the internal resistance value is the highest resistance value when the battery cell BC has reached the durable years and at the lower limit temperature. The minimum value and the maximum value of the internal resistance value are obtained in advance by measurement or estimation. In the present embodiment, a differential voltage Vmin (refer to FIG. 2) that is the minimum value of the differential voltage is obtained based on two kinds of amounts of a current flowing through the battery cell BC that is unused and at the upper limit temperature and on the minimum value of the internal resistance value, and a differential voltage Vmax (refer to FIG. 2) that is the maximum value of the differential voltage is obtained based on two kinds of amounts of a current flowing through the battery cell BC that has reached the durable years and at the lower limit temperature and on the maximum value of the internal resistance value.

Then, the amplification factor is set such that the differential voltage Vmin after being amplified from the obtained minimum differential voltage Vmin is as close as possible to a maximum voltage of the MCU 22 while not exceeding the maximum voltage of the MCU 22. In this case, the amplification factor is used to amplify the minimum differential voltage Vmin, and thus, results in the maximum amplification factor. The amplification factor is also set such that the differential voltage Vmax after being amplified from the maximum differential voltage Vmax is as close as possible to the maximum voltage of the MCU 22 while not exceeding the maximum voltage of the MCU 22. In this case, the amplification factor is used to amplify the maximum differential voltage Vmax, and thus, results in the minimum amplification factor. The maximum voltage of the MCU 22 is the maximum voltage detectable by the MCU 22.

The patterns of the amplification factor are prepared based on the maximum amplification factor and the minimum amplification factor described above. For example, the patterns of the amplification factor are prepared so as to increase the amplification factor stepwise from the minimum amplification factor to the maximum amplification factor. The patterns of the amplification factor are formed by switching the connections of the resistors R of the resistance units R6 to R12. The number of the patterns of the amplification factor can be equal to that of the durable years; that is, for example, 10 patterns are conceivable to be formed if the number of the durable years is 10. However, the number of the patterns is not limited thereto. The resistance units R6 to R12 for setting the amplification factor are configured as described below.

The resistance unit R6 is provided between an inverting input terminal of the operational amplifier OP1 and an inverting input terminal of the operational amplifier OP2. The resistance unit R6 includes a plurality of resistors R61 to R6$n$ each having a different resistance value. Here, "n" is a value representing the maximum number of the resistors R6, and is set as appropriate. The value of "n" can be, for example, a value equal to the number of the durable years of the assembled battery B, but is not limited thereto.

The switch circuit SW60 selects a resistance pattern. The switch circuit SW60 is connected to the MCU 22, and is turned on or off based on a control signal output from the MCU 22. The switch circuit SW60 is provided between the above-described resistance unit R6 and the inverting input terminal of the operational amplifier OP1. The switch circuit SW60 includes a plurality of switches SW61 to SW6$n$. The same number of the switches SW61 to SW6$n$ as that of the resistors R61 to R6$n$ are provided. Each of the switches SW61 to SW6$n$ conducts or shuts off a current through a corresponding one of the resistors R61 to R6$n$. For example, the switch SW61 conducts or shuts off the current through the resistor R61; the switch SW62 conducts or shuts off the current through the resistor R62; and the switch SW6$n$ conducts or shuts off the current through the resistor R6$n$.

The resistance unit R7 is provided between the inverting input terminal of the operational amplifier OP1 and the output terminal V1out of the operational amplifier OP1. The resistance unit R7 includes a plurality of resistors R71 to R7$n$ each having a different resistance value. Here, "n" is a value representing the maximum number of the resistors R7, and is set to the same number as that of the above-described resistors R6.

The switch circuit SW70 selects a resistance pattern. The switch circuit SW70 is connected to the MCU 22, and is turned on or off based on the control signal output from the MCU 22. The switch circuit SW70 is provided between the above-described resistance unit R7 and the inverting input terminal of the operational amplifier OP1. The switch circuit SW70 includes a plurality of switches SW71 to SW7$n$. The same number of the switches SW71 to SW7$n$ as that of the resistors R71 to R7$n$ are provided. Each of the switches SW71 to SW7$n$ conducts or shuts off a current through a corresponding one of the resistors R71 to R7$n$. For example, the switch SW71 conducts or shuts off the current through the resistor R71; the switch SW72 conducts or shuts off the current through the resistor R72; and the switch SW7$n$ conducts or shuts off the current through the resistor R7$n$.

The resistance unit R8 is provided between the inverting input terminal of the operational amplifier OP2 and the output terminal V2out of the operational amplifier OP2. The resistance unit R8 includes a plurality of resistors R81 to R8$n$ each having a different resistance value. Here, "n" is a value representing the maximum number of the resistors R8, and is set to the same number as that of, for example, the above-described resistors R6.

The switch circuit SW80 selects a resistance pattern. The switch circuit SW80 is connected to the MCU 22, and is turned on or off based on the control signal output from the MCU 22. The switch circuit SW80 is provided between the above-described resistance unit R8 and the inverting input terminal of the operational amplifier OP2. The switch circuit SW80 includes a plurality of switches SW81 to SW8$n$. The same number of the switches SW81 to SW8$n$ as that of the resistors R81 to R8$n$ are provided. Each of the switches SW81 to SW8$n$ conducts or shuts off a current through a corresponding one of the resistors R81 to R8$n$. For example, the switch SW81 conducts or shuts off the current through the resistor R81; the switch SW82 conducts or shuts off the current through the resistor R82; and the switch SW8$n$ conducts or shuts off the current through the resistor R8$n$.

The resistance unit R9 is provided between the output terminal V1out of the operational amplifier OP1 and an inverting input terminal of the operational amplifier OP3. The resistance unit R9 includes a plurality of resistors R91 to R9$n$ each having a different resistance value. Here, "n" is a value representing the maximum number of the resistors R9, and is set to the same number as that of, for example, the above-described resistors R6.

The switch circuit SW90 selects a resistance pattern. The switch circuit SW90 is connected to the MCU 22, and is turned on or off based on the control signal output from the MCU 22. The switch circuit SW90 is provided between the above-described resistance unit R9 and the output terminal V1out of the operational amplifier OP1. The switch circuit SW90 includes a plurality of switches SW91 to SW9$n$. The same number of the switches SW91 to SW9$n$ as that of the resistors R91 to R9$n$ are provided. Each of the switches SW91 to SW9$n$ conducts or shuts off a current through a corresponding one of the resistors R91 to R9$n$. For example, the switch SW91 conducts or shuts off the current through the resistor R91; the switch SW92 conducts or shuts off the current through the resistor R92; and the switch SW9$n$ conducts or shuts off the current through the resistor R9$n$.

The resistance unit R10 is provided between the output terminal V2out of the operational amplifier OP2 and a noninverting input terminal of the operational amplifier OP3. The resistance unit R10 includes a plurality of resistors R101 to R10$n$ each having a different resistance value. Here, "n" is a value representing the maximum number of the resistors R10, and is set to the same number as that of, for example, the above-described resistors R6.

The switch circuit SW100 selects a resistance pattern. The switch circuit SW100 is connected to the MCU 22, and is turned on or off based on the control signal output from the MCU 22. The switch circuit SW100 is provided between the above-described resistance unit R10 and the output terminal V2out of the operational amplifier OP2. The switch circuit SW100 includes a plurality of switches SW101 to SW10$n$. The same number of the switches SW101 to SW10$n$ as that of the resistors R101 to R10$n$ are provided. Each of the switches SW101 to SW10$n$ conducts or shuts off a current through a corresponding one of the resistors R101 to R10$n$. For example, the switch SW101 conducts or shuts off the current through the resistor R101; the switch SW102 conducts or shuts off the current through the resistor R102; and the switch SW10$n$ conducts or shuts off the current through the resistor R10$n$.

The resistance unit R11 is provided between the output terminal V3out of the operational amplifier OP3 and the inverting input terminal of the operational amplifier OP3. The resistance unit R11 includes a plurality of resistors R111 to R11$n$ each having a different resistance value. Here, "n" is a value representing the maximum number of the resistors R11, and is set to the same number as that of, for example, the above-described resistors R6.

The switch circuit SW110 selects a resistance pattern. The switch circuit SW110 is connected to the MCU 22, and is turned on or off based on the control signal output from the MCU 22. The switch circuit SW110 is provided between the above-described resistance unit R11 and the inverting input terminal of the operational amplifier OP3. The switch circuit SW110 includes a plurality of switches SW111 to SW11$n$. The same number of the switches SW111 to SW11$n$ as that of the resistors R111 to R11$n$ are provided. Each of the switches SW111 to SW11$n$ conducts or shuts off a current through a corresponding one of the resistors R111 to R11$n$. For example, the switch SW111 conducts or shuts off the current through the resistor R111; the switch SW112 conducts or shuts off the current through the resistor R112; and the switch SW11$n$ conducts or shuts off the current through the resistor R11$n$.

The resistance unit R12 is provided between the noninverting input terminal of the operational amplifier OP3 and a ground. The resistance unit R12 includes a plurality of resistors R121 to R12$n$ each having a different resistance value. Here, "n" is a value representing the maximum number of the resistors R12, and is set to the same number as that of, for example, the above-described resistors R6.

The switch circuit SW120 selects a resistance pattern. The switch circuit SW120 is connected to the MCU 22, and is turned on or off based on the control signal output from the MCU 22. The switch circuit SW120 is provided between the above-described resistance unit R12 and the noninverting input terminal of the operational amplifier OP3. The switch circuit SW120 includes a plurality of switches SW121 to SW12$n$. The same number of the switches SW121 to SW12$n$ as that of the resistors R121 to R12$n$ are provided. Each of the switches SW121 to SW12$n$ conducts or shuts off a current through a corresponding one of the resistors R121 to R12$n$. For example, the switch SW121 conducts or shuts off the current through the resistor R121; the switch SW122 conducts or shuts off the current through the resistor R122; and the switch SW12$n$ conducts or shuts off the current through the resistor R12$n$.

The differential amplification circuit 21 configured as described above amplifies the differential voltage between the first voltage supplied from the capacitor C1 and the second voltage supplied from the capacitor C2 at the amplification factor adjusted by the resistors R, and outputs the result to the MCU 22.

The MCU 22 estimates the degradation of each of the battery cells BC. The MCU 22 is provided with a microprocessor, and includes memories, such as a read-only memory (ROM) and a random access memory (RAM), and peripheral functions, such as input/output (I/O) related functions. The MCU 22 estimates, for example, the degradation of the battery cell BC corresponding to the internal resistance value of the battery cell BC obtained based on the differential voltage output from the differential amplification circuit 21. The MCU 22 includes an analog-to-digital (A/D) converter 22a, a comparator 22b, a first switch controller 22c, a second switch controller 22d, and an arithmetic unit 22e, and these functions are provided on one integrated circuit (IC).

The A/D converter 22a converts an analog signal into a digital signal. The A/D converter 22a converts, for example, the differential voltage (analog signal) output from the differential amplification circuit 21 into the digital signal. The A/D converter 22a is connected to the comparator 22b and the arithmetic unit 22e, and outputs the digitalized differential voltage to the comparator 22b and the arithmetic unit 22e.

The comparator 22b compares voltages. the comparator 22b compares, for example, the differential voltage output from the A/D converter 22a with the maximum voltage representing the highest voltage detectable by the MCU 22. As described above, the maximum voltage is the highest voltage that the MCU 22 can detect. That is, the MCU 22 cannot detect voltages exceeding the maximum voltage. While the maximum voltage is, for example, 5 V in the present embodiment, this voltage value (5 V) is set as appropriate according to the specification of the device. The comparator 22b is connected to the first switch controller 22c, and outputs a comparison result obtained by comparing the differential voltage output from the A/D converter 22a with the maximum voltage detectable by the MCU 22 to the first switch controller 22c.

The first switch controller 22c controls the switch circuits SW60 to SW120 for resistance switching based on the comparison result output from the comparator 22b. The first switch controller 22c controls the switch circuits SW60 to SW120 for resistance switching to switch the connections of the resisters R of the respective resistance units R6 to R12 so as to set the amplification factor of the operational amplifiers OP1 to OP3. For example, if the differential voltage output from the A/D converter 22a has reached the maximum voltage of the MCU 22 in the comparison result output from the comparator 22b, the first switch controller 22c switches the connections of the resisters R of the respective resistance units R6 to R12 to reduce the amplification factor of the operational amplifiers OP1 to OP3.

In an initial state of the assembled battery B, that is, in a state where the assembled battery B is unused (new), the first switch controller 22c switches the connections of the resisters R of the respective resistance units R6 to R12 such that the amplification factor of the operational amplifiers OP1 to OP3 has the highest value. For example, in the initial state of the assembled battery B, the first switch controller 22c turns on the switches SW71, SW81, SW91, SW101, SW111, and SW121 to connect the resistors R61, R71, R81, R91, R101, R111, and R121 that give the maximum amplification factor. If, along with the use of the assembled battery B, the differential voltage output from the A/D converter 22a has reached the maximum voltage of the MCU 22 in the comparison result output from the comparator 22b, the first switch controller 22c switches the connections of the resisters R of the respective resistance units R6 to R12 to reduce the amplification factor of the operational amplifiers OP1 to OP3. The first switch controller 22c turns on, for example, the switches SW72, SW82, SW92, SW102, SW112, and SW122 to connect the resistors R62, R72, R82, R92, R102, R112, and R122 so as to reduce the amplification factor of the operational amplifiers OP1 to OP3.

The second switch controller 22d controls the switch circuits SW10 to SW50 for battery switching. The second switch controller 22d controls the switch circuits SW10 to SW50 for battery switching to select one of the battery cells BC from among the battery cells BC so as to store electrical charges of the selected battery cell BC having different voltages in the capacitors C1 and C2. For example, when the battery cell BC1 is discharged at a first current, the second switch controller 22d turns on the switches SW11, SW21, SW31, and SW41 to store an electrical charge of the battery cell BC1 at the first voltage in the capacitor C1. When the battery cell BC1 is discharged at a second current different from the first current, the second switch controller 22d turns on the switches SW11, SW21, SW32, and SW42 to store an electrical charge of the battery cell BC1 at the second voltage in the capacitor C2.

In a case of switching from the battery cell BC1 to the battery cell BC2, the second switch controller 22d turns on the switches SW12, SW22, SW31, and SW41 to store an electrical charge of the battery cell BC2 at the first voltage in the capacitor C1, and turns on the switches SW12, SW22, SW32, and SW42 to store an electrical charge of the battery cell BC2 at the second voltage in the capacitor C2.

The second switch controller 22d turns on the switches SW51 and SW52 of the switch circuit SW50 so as to output the voltages stored in the capacitors C1 and C2 to the differential amplification circuit 21. In contrast, the second switch controller 22d turns off the switches SW51 and SW52 so as not to output the power stored in the capacitors C1 and C2 to the differential amplification circuit 21. That is, the second switch controller 22d turns off the switches SW51 and SW52 to cut off the electrical connection of the capacitors C1 and C2 to the differential amplification circuit 21.

The arithmetic unit 22e estimates the degradation of the battery cell BC based on the differential voltage. The arithmetic unit 22e calculates the internal resistance value of the battery cell BC, for example, based on the differential voltage output from the A/D converter 22a and the currents (the first current and the second current) output from a current detector (not illustrated). The internal resistance value can be calculated using a known calculation method. For example, let "I1" denote the first current, "I2" denote the second current different from the first current, "V1" denote the voltage of the capacitor C1 when the first current is conducted, "V2" denote the voltage of the capacitor C2 when the second current is conducted, "G" denote the amplification factor of the operational amplifiers OP1 to OP3, and "R" denote the internal resistance value. Then, the internal resistance value is obtained by Expression (1) below.

$$R=|(G\times(V2-V1))/(G\times(I2-I1))| \qquad (1)$$

The arithmetic unit 22e estimates the degradation of the battery cell BC according to the internal resistance value obtained based on Expression (1) above. For example, the arithmetic unit 22e estimates that the battery cell BC has been degraded if the obtained internal resistance value is relatively high (for example, higher than an initial value at the start of use), or estimates that the battery cell BC has not been degraded if the obtained internal resistance value is relatively low (for example, has not changed by a large amount relative to the initial value at the start of use). If the obtained internal resistance value exceeds a preset reference value, the arithmetic unit 22e determines that the battery cell BC has reached the time for replacement due to the degradation of the battery cell BC.

Figure 3:
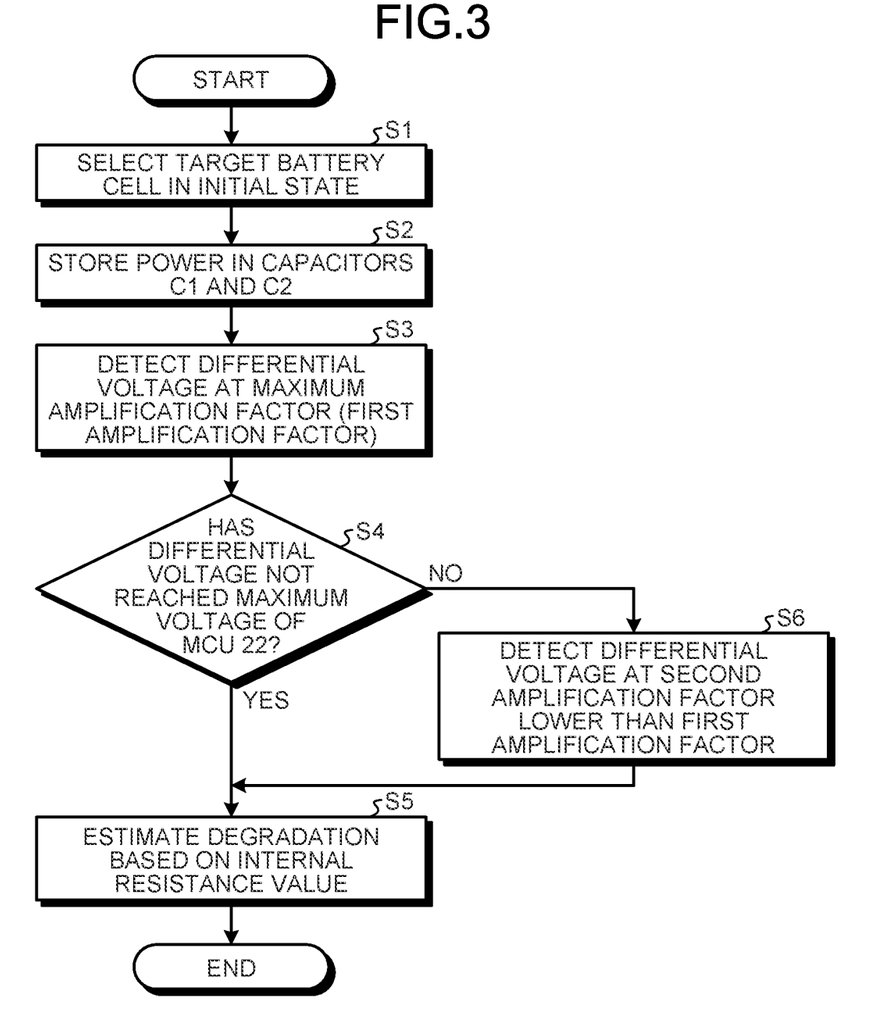
FIG. 3 is a flowchart illustrating an operation example of the battery state detection device according to the embodiment.

The following describes an operation example of the battery state detection device 1. FIG. 3 is a flowchart illustrating the operation example of the battery state detection device 1 according to the embodiment. As illustrated in FIG. 3, in the initial state of the assembled battery B, the battery state detection device 1 selects the target battery cell BC to be estimated for the degradation (Step S1). For example, the second switch controller 22d of the MCU 22 turns on the switches SW11 and SW21 when the battery cell BC1 is discharged at the first current. Then, the second switch controller 22d stores electrical charges in the capacitors C1 and C2 (Step S2). For example, the second switch controller 22d turns on the switches SW31 and SW41 to store the first voltage of the battery cell BC1 in the capacitor C1. The second switch controller 22d turns off the switches SW31 and SW41 after the electrical charge is stored in the capacitor C1. When the battery cell BC1 is discharged at the second current, the second switch controller 22d turns on the switches SW32 and SW42 to store the second voltage of the battery cell BC1 in the capacitor C2.

Then, the MCU 22 detects the differential voltage at the maximum amplification factor (first amplification factor) (Step S3). For example, in the initial state of the assembled battery B, the first switch controller 22c turns on the switches SW61, SW71, SW81, SW91, SW101, SW111, and SW121 to connect the resistors R61, R71, R81, R91, R101, R111, and R121 that give the maximum amplification factor. Then, the differential amplification circuit 21 amplifies the differential voltage between the first voltage supplied from the capacitor C1 and the second voltage supplied from the capacitor C2 at the set amplification factor, and outputs the result to the MCU 22.

Then, the MCU 22 determines whether the differential voltage output from the differential amplification circuit 21 has reached the maximum voltage of the MCU 22 (Step S4). If the differential voltage output from the A/D converter 22a has not reached the maximum voltage of the MCU 22 (Yes at Step S4), the arithmetic unit 22e calculates the internal resistance value of the battery cell BC based on the differential voltage. Then, the arithmetic unit 22e estimates the degradation of the battery cell BC based on the obtained internal resistance value (Step S5).

In contrast, if the differential voltage output from the A/D converter 22a has reached the maximum voltage of the MCU 22 (No at Step S4), the MCU 22 detects the differential voltage at a second amplification factor lower than the first amplification factor (Step S6). For example, the first switch controller 22c turns on the switches SW62, SW72, SW82, SW92, SW102, SW112, and SW122 to connect the resistors R62, R72, R82, R92, R102, R112, and R122 so as to reduce the amplification factor of the operational amplifiers OP1 to OP3. The arithmetic unit 22e obtains the internal resistance value of the battery cell BC based on the differential voltage amplified at the reduced amplification factor, and estimates the degradation of the battery cell BC based on the obtained internal resistance value (Step S5).

As described above, the voltage detection circuit 20 according to the embodiment includes the differential amplification circuit 21 and the MCU 22. The differential amplification circuit 21 includes the input terminal V1in, the input terminal V2in, the amplification factor adjustment circuit 21a, the operational amplifiers OP1 to OP3, and the output terminal V3out. The input terminal V1in receives the first voltage supplied from the battery cell BC. The input terminal V2in receives the second voltage that is the voltage different from the first voltage and is supplied from the battery cell BC. The amplification factor adjustment circuit 21a is a circuit capable of adjusting the voltage amplification factor. The operational amplifiers OP1 to OP3 amplify the differential voltage between the first voltage received from the input terminal V1in and the second voltage received from the input terminal V2in at the amplification factor adjusted by the amplification factor adjustment circuit 21a. The output terminal V3out outputs the differential voltage amplified by the operational amplifiers OP1 to OP3. The MCU 22 detects the differential voltage output from the operational amplifiers OP1 to OP3 of the differential amplification circuit 21, and calculates the internal resistance value of the battery cell BC based on the detected differential voltage, and controls the amplification factor adjustment circuit 21a. At this time, the MCU 22 controls the amplification factor adjustment circuit 21a based on the maximum voltage representing the highest voltage detectable by the MCU 22 and the differential voltage output from the output terminal V3out of the differential amplification circuit 21 so as to set the amplification factor of the operational amplifiers OP1 to OP3.

With this configuration, even when the internal resistance value is changed by the degradation of the battery cell BC, the voltage detection circuit 20 can adjust the amplification factor of the operational amplifiers OP1 to OP3 to make the above-described differential voltage closer to the maximum voltage of the MCU 22 within a range in which the differential voltage output from the differential amplification circuit 21 does not exceed the maximum voltage detectable by the MCU 22. Thus, the voltage detection circuit 20 can accurately detect the internal resistance value of the battery based on the differential voltage, and can properly estimate a degradation state (State of Health (SOH)) of the battery corresponding to the detected internal resistance value.

In the above-described voltage detection circuit 20, when the differential voltage output from the output terminal V3out of the differential amplification circuit 21 has reached the maximum voltage of the MCU 22, the MCU 22 controls the amplification factor adjustment circuit 21a to reduce the amplification factor of the operational amplifiers OP1 to OP3. With this configuration, even when the internal resistance value is changed by the degradation of the battery cell BC, the voltage detection circuit 20 can make the above-described differential voltage closer to the maximum voltage of the MCU 22 within a range in which the differential voltage output from the differential amplification circuit 21 does not exceed the maximum voltage detectable by the MCU 22.

In the above-described voltage detection circuit 20, the amplification factor adjustment circuit 21a includes the resistors R and the switch circuits SW60 to SW120 that switch the connections of the resistors R, and causes the switch circuits SW60 to SW120 to switch the connections of the resistors R so as to adjust the amplification factor of the operational amplifiers OP1 to OP3. This configuration allows the voltage detection circuit 20 to adjust the amplification factor of the operational amplifiers OP1 to OP3 based on the resistance values of the resistors R.

Modification

Figure 4:
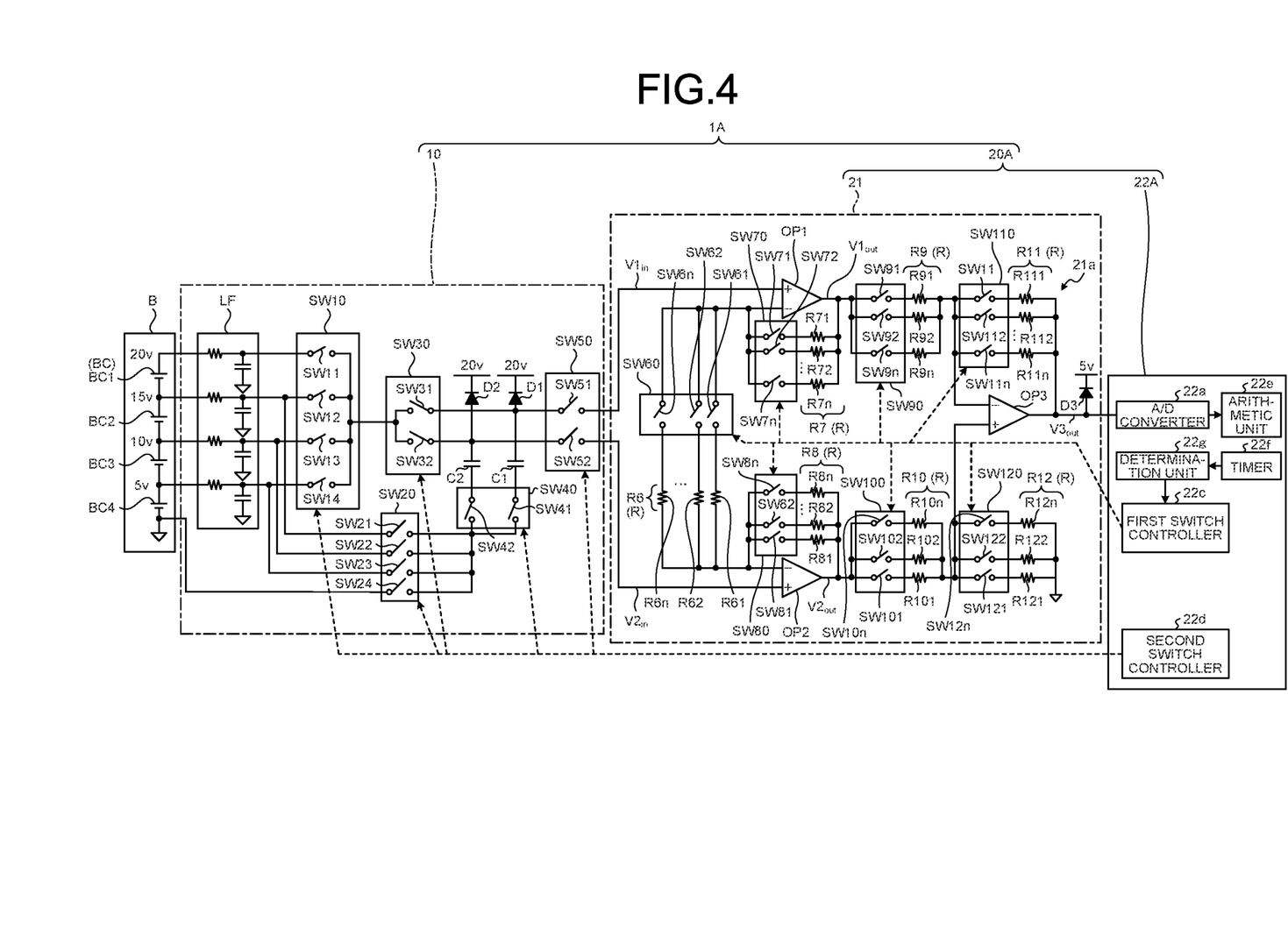
FIG. 4 is a circuit diagram illustrating a configuration example of a battery state detection device according to a modification of the embodiment.

The following describes a modification of the embodiment. In the modification, the same components as those of the embodiment are denoted by the same reference numerals, and will not be described in detail. FIG. 4 is a circuit diagram illustrating a configuration example of a battery state detection device 1A according to the modification of the embodiment. The battery state detection device 1A according to the modification differs from the battery state detection device 1 according to the embodiment in that the amplification factor of the operational amplifiers OP1 to OP3 is set according to a period of use in which the battery cell BC has been used.

As illustrated in FIG. 4, the battery state detection device 1A includes the battery switching circuit 10 and a voltage detection circuit 20A. The voltage detection circuit 20A includes the differential amplification circuit 21 and an MCU 22A.

The MCU 22A includes a table explaining a relation between the patterns of the amplification factor and the period of use of the battery cell BC, a timer 22f that measures the period of use of the battery cell BC, a determination unit 22g that determines the amplification factor based on an output value of the timer 22f, the A/D converter 22a, the first switch controller 22c, the second switch controller 22d, and the arithmetic unit 22e, and these functions are provided on one IC.

The above-mentioned table explains, for example, that the first amplification factor is to be set when a period of use of one year has elapsed, the second amplification factor lower than the first amplification factor is to be set when a period of use of two years has elapsed, and an nth amplification factor lower than an (n−1)th amplification factor is to be set when a period of use of n years has elapsed. These amplification factors are set within a range in which the differential voltage output from the differential amplification circuit 21 does not exceed a maximum voltage detectable by the MCU 22A even when the internal resistance value is changed by the degradation of the battery cell BC. In the above-described table, the correspondence between the period of use and the amplification factor is merely an example, and another method of correspondence may be used.

The determination unit 22g determines the amplification factor of the operational amplifiers OP1 to OP3 based on the period of use measured by the timer 22f and the amplification factors registered in the table. For example, the determination unit 22g determines the amplification factor to be the first amplification factor when the period of use measured by the timer 22f has exceeded one year, determines the amplification factor to be the second amplification factor when the period of use measured by the timer 22f has exceeded two years, and determines the amplification factor to be the nth amplification factor when the period of use measured by the timer 22f has exceeded n years. Then, the determination unit 22g outputs the determined amplification factor to the first switch controller 22c. The first switch controller 22c controls the switch circuits SW60 to SW120 of the amplification factor adjustment circuit 21a based on the amplification factor output from the determination unit 22g so as to set the amplification factor of the operational amplifiers OP1 to OP3.

As described above, the MCU 22A may control the amplification factor adjustment circuit 21a to set the amplification factor of the operational amplifiers OP1 to OP3 according to the period of use in which the battery cell BC has been used. With this configuration, even when the internal resistance value is changed by the degradation of the battery cell BC, the MCU 22A can make the above-described differential voltage closer to the maximum voltage of the MCU 22A within the range in which the differential voltage output from the differential amplification circuit 21 does not exceed the maximum voltage detectable by the MCU 22A. Thus, the MCU 22A can accurately detect the internal resistance value of the battery based on the differential voltage, and can properly estimate the degradation of the battery corresponding to the detected internal resistance value.

In the above description, the example has been described where the assembled battery B is a lithium-ion battery. However, the assembled battery B is not limited thereto, and may be another battery.

The examples have been described where the battery state detection devices 1 and 1A estimate the degradation of each of the battery cells BC1 to BC4 of the assembled battery B mounted on the vehicle. However, the battery state detection devices 1 and 1A are not limited to these examples, and may estimate the degradation of the assembled battery B mounted on a device other than the vehicle.

The example has been described where what are called the operational amplifiers constitute the instrumentation amplifier of the differential amplification circuit 21. However, the differential amplification circuit 21 may be another amplification circuit.

The example has been described where the amplification factor adjustment circuit 21a includes the resistors R and the switch circuits SW60 to SW120 that switch the connections of the resistors R. However, the amplification factor adjustment circuit 21a is not limited thereto, and may have another configuration.

The example has been described where the MCU 22A sets the amplification factor of the operational amplifiers OP1 to OP3 according to the period of use in which the battery cell BC has been used. However, the MCU 22A is not limited thereto, and may set the amplification factor of the operational amplifiers OP1 to OP3 according to, for example, the internal resistance value of the battery cell BC.

The example has been described where the MCU 22 includes the A/D converter 22a, the comparator 22b, the first switch controller 22c, the second switch controller 22d, and the arithmetic unit 22e, and these functions are provided on one IC. However, the above-listed functions are not limited thereto, and may be distributed on a plurality of ICs.

The example has been described where the MCU 22A includes the table, the timer 22f, the determination unit 22g, the A/D converter 22a, the first switch controller 22c, the second switch controller 22d, and the arithmetic unit 22e, and these functions are provided on one IC. However, the above-listed functions are not limited thereto, and may be distributed on a plurality of ICs.

A voltage detection device according to the present embodiment sets an amplification factor of an amplification circuit based on a maximum voltage representing the highest voltage detectable by a control circuit and a differential voltage output from a differential amplification circuit, and thereby, can make the differential voltage output from the differential amplification circuit closer to the maximum voltage within a range not exceeding the maximum voltage of the control circuit. Thus, the voltage detection device can accurately detect an internal resistance value of a battery. The voltage detection device according to the present embodiment sets the amplification factor of the amplification circuit according to a period of use in which the battery has been used, and thereby, can make the differential voltage output from the differential amplification circuit closer to the maximum voltage within the range not exceeding the maximum voltage of the control circuit. Thus, the voltage detection device can accurately detect the internal resistance value of the battery.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A voltage detection device comprising:
a differential amplification circuit configured to include a first input terminal configured to receive a first voltage of power supplied from a battery, a second input terminal configured to receive a second voltage of the power that is a voltage different from the first voltage and is supplied from the battery, an amplification factor adjustment circuit capable of adjusting a voltage amplification factor, an amplification circuit configured to amplify a differential voltage between the first voltage received from the first input terminal and the second voltage received from the second input terminal at the amplification factor adjusted by the amplification factor adjustment circuit, and an output terminal configured to output the differential voltage amplified by the amplification circuit; and
a control circuit configured to detect the differential voltage output from the differential amplification circuit and calculate an internal resistance value of the battery based on the differential voltage, and configured to control the amplification factor adjustment circuit, wherein
the control circuit is configured to adjust the amplification factor adjustment circuit based on a maximum voltage representing a highest voltage detectable by the control circuit and the differential voltage output from the output terminal so as to adjust the amplification factor of the amplification circuit.

2. The voltage detection device according to claim 1, wherein
the control circuit is configured to control the amplification factor adjustment circuit to reduce the amplification factor of the amplification circuit when the differential voltage output from the output terminal has reached the maximum voltage.

3. The voltage detection device according to claim 1, wherein
the amplification factor adjustment circuit includes a plurality of resistors and a switch circuit configured to switch connections of the resistors, and is configured to cause the switch circuit to switch the connections of the resistors so as to adjust the amplification factor of the amplification circuit.

4. The voltage detection device according to claim 2, wherein
the amplification factor adjustment circuit includes a plurality of resistors and a switch circuit configured to switch connections of the resistors, and is configured to cause the switch circuit to switch the connections of the resistors so as to adjust the amplification factor of the amplification circuit.

5. A voltage detection device comprising:
a differential amplification circuit configured to include a first input terminal configured to receive a first voltage of power supplied from a battery, a second input terminal configured to receive a second voltage of the power that is a voltage different from the first voltage and is supplied from the battery, an amplification factor adjustment circuit capable of adjusting a voltage amplification factor, an amplification circuit configured to amplify a differential voltage between the first voltage received from the first input terminal and the second voltage received from the second input terminal at the amplification factor adjusted by the amplification factor adjustment circuit, and an output terminal configured to output the differential voltage amplified by the amplification circuit; and
a control circuit configured to detect the differential voltage output from the differential amplification circuit and calculate an internal resistance value of the battery based on the differential voltage, and configured to control the amplification factor adjustment circuit, wherein
the control circuit is configured to adjust the amplification factor adjustment circuit according to a period of use in which the battery has been used so as to adjust the amplification factor of the amplification circuit.

* * * * *